(12) United States Patent
Burak (10) Patent No.: US 6,813,297 B2
(45) Date of Patent: Nov. 2, 2004

(54) MATERIAL SYSTEMS FOR LONG WAVELENGTH LASERS GROWN ON GASB OR INAS SUBSTRATES

(75) Inventor: Dariusz Burak, Fremont, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/196,872

(22) Filed: Jul. 16, 2002

(65) Prior Publication Data

US 2004/0013155 A1 Jan. 22, 2004

(51) Int. Cl.⁷ .................................. H01S 5/00
(52) U.S. Cl. .......................... 372/45; 372/46
(58) Field of Search ............... 372/45, 50, 54, 372/43, 46, 75, 96, 70; 257/76, 194

(56) References Cited

U.S. PATENT DOCUMENTS

| | | | | |
|---|---|---|---|---|
| 5,577,061 A | * | 11/1996 | Hasenberg et al. | ......... 372/45 |
| 5,583,878 A | * | 12/1996 | Shimizu et al. | ......... 372/45 |
| 5,594,750 A | * | 1/1997 | Zhang et al. | ......... 372/45 |
| 5,726,462 A | * | 3/1998 | Spahn et al. | ......... 257/76 |
| 5,793,787 A | * | 8/1998 | Meyer et al. | ......... 372/45 |
| 6,133,593 A | * | 10/2000 | Boos et al. | ......... 257/194 |
| 6,233,264 B1 | * | 5/2001 | Sato | ......... 372/45 |
| 6,449,299 B1 | * | 9/2002 | Sato | ......... 372/45 |
| 6,546,031 B1 | * | 4/2003 | Jewell et al. | ......... 372/45 |
| 6,642,070 B2 | * | 11/2003 | Jiang et al. | ......... 438/22 |
| 2001/0043636 A1 | * | 11/2001 | Bewley et al. | ......... 372/70 |
| 2002/0024989 A1 | * | 2/2002 | Coldren et al. | ......... 372/96 |
| 2002/0071471 A1 | * | 6/2002 | Kim et al. | ......... 372/96 |
| 2002/0074631 A1 | * | 6/2002 | Sato et al. | ......... 257/676 |
| 2002/0126720 A1 | * | 9/2002 | Yang | ......... 372/45 |
| 2002/0154675 A1 | * | 10/2002 | Deng et al. | ......... 372/96 |
| 2003/0013224 A1 | * | 1/2003 | Shimizu et al. | ......... 438/47 |
| 2003/0043872 A1 | * | 3/2003 | Yokozeki et al. | ......... 372/45 |
| 2003/0048824 A1 | * | 3/2003 | Shinagawa et al. | ......... 372/46 |
| 2003/0053503 A1 | * | 3/2003 | Yang | ......... 372/45 |
| 2003/0103543 A1 | * | 6/2003 | Moser et al. | ......... 372/96 |
| 2003/0202550 A1 | * | 10/2003 | Goyal et al. | ......... 372/45 |

OTHER PUBLICATIONS

D.I. Babic, J. Piprek and J.E. Bowers, "Long–wavelength vertical–cavity lasers", in C.W. Wilmsen, H. Temkin and L.A. Coldren (Eds.) "Vertical–cavity surface–emitting lasers", Cambridge University Press, Cambridge, UK, 1999.

E. Hall, S. Nakagawa, G. Almuneau, J.K. Kim amd L.A. Coldren, "Room–temperature, CW operation of lattice–matched long–wavelength VCSELs", Electronics Letters, vol. 36, p. 1465 (2000).

F. Genty, G. Almuneau, L. Chusseau, A. Wilk, S. Gaillard, G. Boissier, P. Grech and J. Jacquet, "Growth and chacraterization of vertical cavity structures on InP with GaAsSb/AlAsSb Bragg mirrors for 1.55um emission", J. Crystal Growth, vol. 201/201, p. 1024 (1999).

(List continued on next page.)

*Primary Examiner*—Don Wong
*Assistant Examiner*—Tuan N. Nguyen
(74) *Attorney, Agent, or Firm*—Judy I. Shie (57) ABSTRACT

A vertical cavity surface emitting laser (VCSEL) capable of producing long-wavelength light has a substrate of GaSb or InAs, and an active region with alternating quantum wells and barrier layers. The target wavelength range is preferably between 1.2–1.4 um. The quantum well is made of GaInSbP, GaInSbAs, AlInSbAs, or AlInSbP, and the barrier layers are made of AlInSbP, AlGaSbP, AlInSbAs, AlGaSbAs, or AlSb-PAs. The active region is sandwiched between two mirror stacks that are preferably epitaxially grown Distributed Bragg Reflectors. The active region has large conduction and valence band offsets ($\Delta E_c$ and $\Delta E_v$) for effective carrier containment over the wide range of ambient temperatures in which the VCSEL is expected to function. The active region can be designed to have little or no lattice strain on the substrate.

19 Claims, 5 Drawing Sheets

OTHER PUBLICATIONS

G. Steinle, H. Riechert and A. Yu Egorov, "Monolitic VCSEL with InGaAsN active region emitting at 1.28um and CW output power exceeding 500uW at room temperature", Electronics Letters, vol. 37, p. 93 (2001).

A.W. Jackson, R.L. Naone, M.J. Dalberth, J.M. Smith, K.J. Malone, D.W. Kisker, J.F. Klem, K.D. Choquette, D.K. Serkland and K.M. Geib, "OC–48 capable InGaAsN vertical cavity lasers", Electronics Letters, vol. 37, p. 355 (2001).

T. Anan, M. Yamada, K. Nishi, K. Kurihara, K. Tokutume, A. Kamei and S. Sugou, "Continuous–wave operation of 1.30um GaAsSb/GaAs VCSELs", Electronics Letters, vol. 37, p. 566 (2001).

S.K. Mathis, K.H. A. Lau, A.M. Andrews and E.M. Hall, "Lateral oxidation kinetics of AlAsSb and related alloys lattice matched to InP", J. Applied Physics, vol. 89, p. 2458 (2001).

A.N. Baranov, Y. Rouillard, G. Boissier, P. Grech, S. Galliard and C. Aibert, "Sb–based monolithic VCSEL operating near 2.2um at room temperature", Electronics Letters, vol. 34, p. 281 (1998).

D.A. Yarekha, G. Glastre, A. Perona, Y. Rouillard, F. Genty, E.M. Skouri, G. Boissier, P. Grech, A. Joullie, C. Aibert and A.N. Baranov, "High temperature GaInSbAs/GaAlSbAs quantum well single mode continuous wave lasers emitting near 2.3um", Electronics Letters, vol. 26, p. 537 (2000).

G. Alumeau, F. Genty, A. Wilk, P. Grech, A. Joullie and L. Chusseau, "GaInSb/AlGaAsSb strained quantum well semiconductor lasers for 1.55um operation", Semiconductor Science and Technology, vol. 14, p. 89 (1999).

J. Koeth, R. Dietrich and A. Forchel, "GaSb vertical–cavity surface–emitting lasers for 1.5um range", Applied Physics Letters, vol. 72, p. 1638 (1998).

I. Vurgaftman, J.R. Meyer and L.R. Ram–Mohan, "Band parameters for III–V compound semiconductors and their alloys", J. Applied Physics, vol. 89, p. 5815 (2001).

G.B. Stringfellow, "Organometallic vapor–phase epitaxy: theory and practice", Academic Press, New York, 1999, $2^{nd}$ Edition, Chapters 8.

M.J. Jou, D.H. Jaw, Z.M. Fang and G.B. Stringfellow, Organometallic vapor phase epitaxial growth of a new quaternary semiconductor alloy GaInPSb, J. Crystal Growth, vol. 106, p. 208 (1990).

* cited by examiner

MATERIAL SYSTEMS FOR LONG WAVELENGTH LASERS GROWN ON GASB OR INAS SUBSTRATES

FIELD OF THE INVENTION

The invention is directed towards the field of lasers, and more specifically, towards alloys that can be used in the active region of a laser.

BACKGROUND OF THE INVENTION

Figure 1:
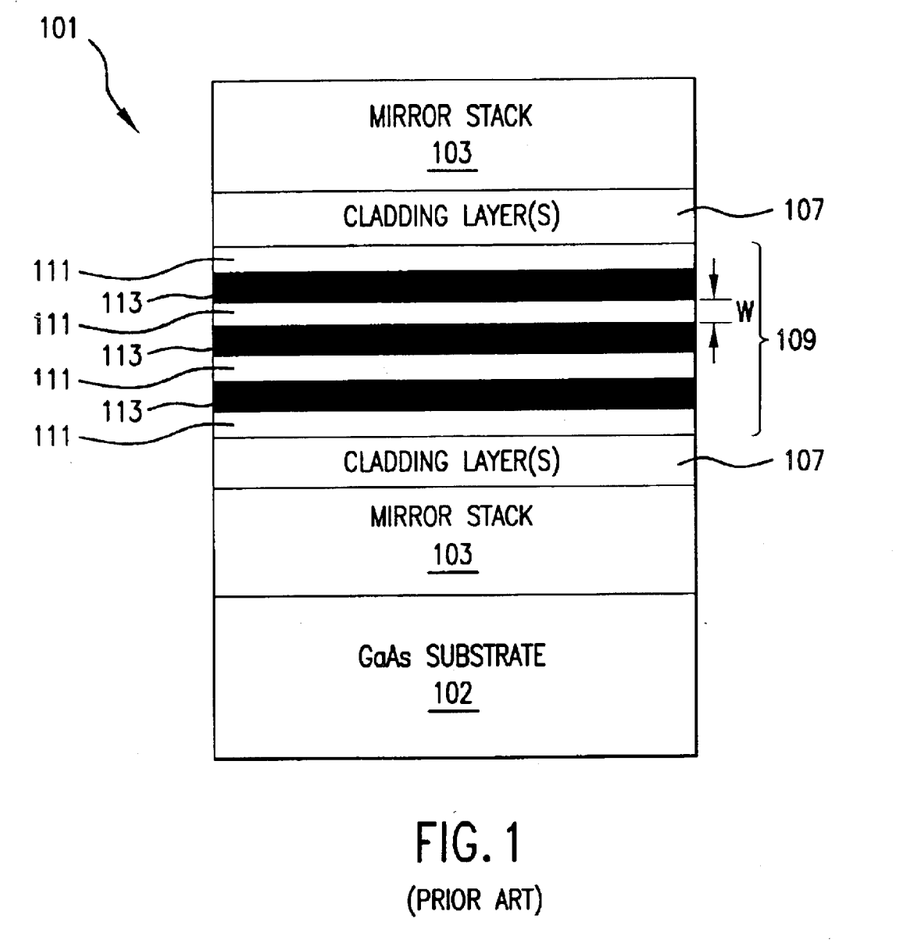
FIG. 1 is a simplified cross-sectional side view of a prior art VCSEL based on a GaAs substrate.

Vertical cavity surface emitting lasers (VCSELs) are commonly used as light sources in optical communication systems. FIG. 1 shows a diagram of a prior art VCSEL 101, based on a gallium arsenide (GaAs) substrate 102. VCSEL 101 emits light at 850 nm. Two mirror stacks 103, one adjacent to the substrate 102 and one at the top of the VCSEL 101, reflect the laser light within the VCSEL 101. The mirror stacks 103 are typically Distributed Bragg Reflectors (DBRs) made of alternating layers of $Al_xGa_{1-x}As$ and $Al_yGa_{1-y}As$, where "x" and "y" denote the molecular fractions of Al in high and low refractive index layers, respectively. A cladding layer 107 is adjacent to each mirror stack 103. Although each cladding layer 107 is illustrated as a single layer, it may be composed of many different layers. The cladding layer 107 may also be called a spacer, and is used to pad the size of an active region 109 so that the VCSEL 101 will work properly. Sandwiched between the mirror stacks 103 and cladding layers 107 is the active region 109, comprising interleaved layers of quantum wells 111 and barrier layers 113. The quantum wells 111 have a width w. The quantum wells 111 are typically GaAs, and the barrier layers 113 are typically AlGaAs. Hereinafter, VCSELs shall be referred to by the composition of their active region. Therefore, the VCSEL 101 can be identified as a GaAs/AlGaAs VCSEL, or alternatively as a VCSEL with a GaAs/AlGaAs active region.

Figure 2:
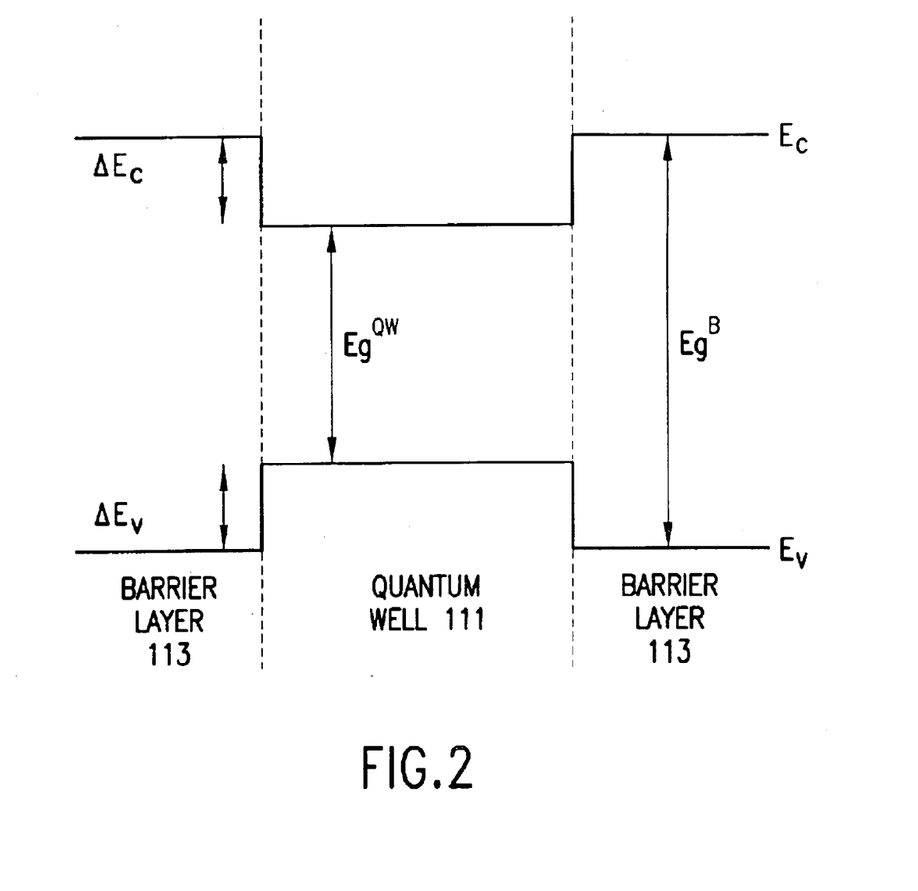
FIG. 2 shows an energy-band diagram for the active region of a laser such as a VCSEL.

FIG. 2 shows an energy-band diagram identifying selected band parameters for an active region of a laser such as the VCSEL 101 shown in FIG. 1. The conduction band is labeled $E_c$ and the valence band is labeled $E_v$. The difference between the conduction band $E_c$ and the valence band $E_v$ is known as a band gap. The band gap of the quantum well 111 is labeled $Eg^{QW}$. The band gap of the barrier layer 113 is labeled $Eg^B$. The difference between the conduction bands $E_c$ of the quantum well 111 and the barrier layer 113 is known as the conduction band offset, labeled $\Delta E_c$. The difference between the valence bands $E_v$ of the quantum well 111 and the barrier layer 113 is known as the valence band offset, labeled $\Delta E_v$. Electrons and holes (collectively known as carriers) are injected into the quantum well 111 and confined by the barrier layers 113 when the VCSEL is forward biased. Ideally, the materials used in the quantum wells 111 and barrier layers 113 have a relatively large $\Delta E_c$ and $\Delta E_v$ to provide effective carrier confinement in the quantum well 111. In a typical GaAs/AlGaAs VCSEL 101, $\Delta E_c \approx 150$ meV and $\Delta E_v \approx 75$ meV. Note that $\Delta E_c$ is twice $\Delta E_v$; a 2:1 ratio between $\Delta E_c$ and $\Delta E_v$ is often considered indicative of a well-balanced material system.

Carriers inside the quantum well 111 actually acquire a slight amount of energy as a result of their confinement, effectively increasing the quantum well bandgap $Eg^{QW}$ by the energy of quantum confinement $dE_{qc}$ (not shown). $dE_{qc}$ is a function of the quantum well width w, increasing as w is decreased. When the active region 109 is not lattice-matched to the substrate 102, the carriers within the quantum well acquire an additional energy due to lattice strain $dE_{strain}$ (not shown). Although the band parameters described above refer specifically to the active region 109 of the VCSEL 101, the terms are equally applicable to the active region of any laser.

Light is emitted from the quantum well 111 when electrons drop from the conduction band $E_c$ to the valence band $E_v$. The wavelength of light emitted is determined approximately by the formula:

$$\lambda_{um} \approx \frac{1.24 \text{ eV}}{E_g^{QW} + dE_{qc} + dE_{strain}} \quad \text{(Equation 1)}$$

In Equation 1, $E_g^{QW}$ is the greatest contributing factor in determining the wavelength, as it is typically much larger than $dE_{qc}$ or $dE_{strain}$. The material used for the quantum well 111 should be selected to have a band gap $E_g^{QW}$ that will produce light within the desired range of wavelengths. The quantum well width w and lattice strain on the substrate 102 will also be a consideration because of $dE_{qc}$ and $dE_{strain}$.

GaAs/AlGaAs is ideal for the active region in a GaAs-substrate VCSEL for several reasons. First, GaAs and AlGaAs can be used to implement both the mirror stacks 103 and the active region 109, thus simplifying the manufacturing process because there is no need to change the growth conditions. Second, mirror stacks 103 using AlGaAs/AlGaAs can be epitaxially grown on the GaAs substrate 102, which results in a VCSEL that is entirely grown epitaxially. Since fully-epitaxial VCSELS are easier to manufacture and process, they are preferred over VCSELS having mirror stacks formed with other methods such as fusion bonding or deposition. Third, GaAs/AlGaAs VCSELs can be oxidized. Oxidized layers are often used in a VCSEL to electrically confine carriers and optically confine the laser beam, which leads to improved electro-optical performance of the device.

One final reason that GaAs/AlGaAs VCSELs work well is due to their low sensitivity to temperature. A VCSEL typically has to maintain performance within an operating temperature range between 0–100° C. One parameter used to measure temperature sensitivity is known as the characteristic temperature $T_0$. $T_0$ is usually determined for broad area lasers (also known as edge-emitting lasers), not for VCSELs. However, the $T_0$ of an edge-emitting laser built with a given active region is still a useful indicator of how that same active region will perform with temperature changes in a VCSEL. A high characteristic temperature $T_0$ is preferable because it means the laser is less sensitive to temperature fluctuations. An edge-emitting laser built with a GaAs/AlGaAs active region typically has a characteristic temperature $T_0$ around 150K, which is relatively high. The characteristic temperature $T_0$ is also related to $\Delta E_c$ and $\Delta E_v$—an active region with large $\Delta E_c$ and $\Delta E_v$ will likely exhibit high $T_0$ and low threshold current density, provided that the material quality is good.

The light emitted from a GaAs/AlGaAs VCSEL typically has a wavelength around 850 nm, which allows for a transmission range of 200–500 m in multimode fiber, depending on the speed of the optical link. Currently, the challenge facing the optical communications industry is creating a VCSEL capable of emitting light with a longer wavelength, which can travel longer distances along a single-mode optical fiber. The preferable target wavelength range is between 1.2 um and 1.4 um, or more specifically, 1260–1360 nm, which would produce transmission ranges of 2–40 km. The ideal long-wavelength VCSEL would possess the same qualities as a GaAs/AlGaAs VCSEL (i.e.

epitaxially grown mirrors, active regions that are lattice matched to the substrate, good carrier containment, low sensitivity to temperature changes, etc.) except with a longer wavelength of emitted light.

Several material systems have been proposed that would emit light within the target range. One approach is using InGaAsN/GaAs or InGaAsN/GaAsN (hereinafter collectively referred to as InGaAsN/GaAs(N)) in the active region on a GaAs substrate. InGaAsN/GaAs(N) has acceptable performance over the desired temperature range. Unfortunately, although InGaAsN/GaAs(N) can be epitaxially grown on the GaAs substrate, the lattice structure does not match well to the GaAs substrate and introduces a compressive strain of 3% or more. Such a large strain may cause undesirable reliability problems in a VCSEL.

Another approach to long-wavelength VCSELs involves using a substrate of indium phosphide (InP). InP has been researched extensively as a VCSEL substrate, and many materials have been identified that can form epitaxially-grown mirror stacks on InP. For example, InGaAsP/InP was a promising material system for VCSELs, since InGaAsP can be lattice-matched to the InP substrate and epitaxially grown to create mirror stacks. However, the small conduction band offset ($\Delta E_c$) in an InGaAsP/InP active region does not allow for effective electron confinement at elevated temperatures. Since VCSELs must operate over a wide range of temperatures up to 100° C., the InGaAsP/InP material system is not an ideal solution. Another drawback to the InGaAsP/InP material system is that it cannot be oxidized to create the desired optical and electrical confinement within the VCSEL.

AlInGaAs/AlInGaAs active regions grown on InP have also been investigated. However, the characteristic temperature of edge-emitting lasers made with AlInGaAs/AlInGaAs is only in the range of 100–120K. A higher characteristic temperature would be preferable to minimize the VCSEL's sensitivity to temperature changes. This is especially important since the thermal conductivity of epitaxial mirrors grown on InP substrates is known to be low.

Therefore, a need remains for a VCSEL long-wavelength material system that has relatively large band offsets ($\Delta Ec$ and $\Delta Ev$) for effective carrier confinement within the quantum wells in the temperature range of interest, with a lattice structure that substantially matches the substrate's lattice structure, and a relatively high characteristic temperature. Preferably, the mirror stacks of the VCSEL can be epitaxially grown on the substrate. It would also be preferable that the mirrors can be oxidized, since oxidation is an effective way to provide electrical and optical confinement of currents and optical beams.

SUMMARY OF THE INVENTION

In accordance with an illustrated preferred embodiment of the present invention, a VCSEL based on a GaSb substrate is disclosed. The VCSEL has a first mirror stack and second mirror stack, the first mirror stack adjacent to the substrate. Sandwiched between the two mirror stacks are two cladding layers. Sandwiched between the two cladding layers is an active region. The mirror stacks are preferably grown epitaxially, although other methods of fabricating the mirror stacks are acceptable. The active region uses GaInSbP, AlInSbAs, GaInSbAs, or AlInSbP quantum wells interleaved with barrier layers of AlInSbP, AlGaSbP, AlInSbAs, AlGaSbAs, or AlSbPAs. Alternatively, the VCSEL can be based on a substrate of InAs.

As will be discussed in the following section, the present invention advantageously provides an active region that not only emits light within the desired long-wavelength range, but also has a relatively low-strain lattice structure on considered substrates. Furthermore, the present invention provides effective carrier containment over the entire operating temperature range. This is a combination of features not available in the prior art.

Further features and advantages of the present invention, as well as the structure and operation of preferred embodiments of the present invention, are described in detail below with reference to the accompanying exemplary drawings. In the drawings, like reference numbers indicate identical or functionally similar elements.

DETAILED DESCRIPTION

Figure 3:
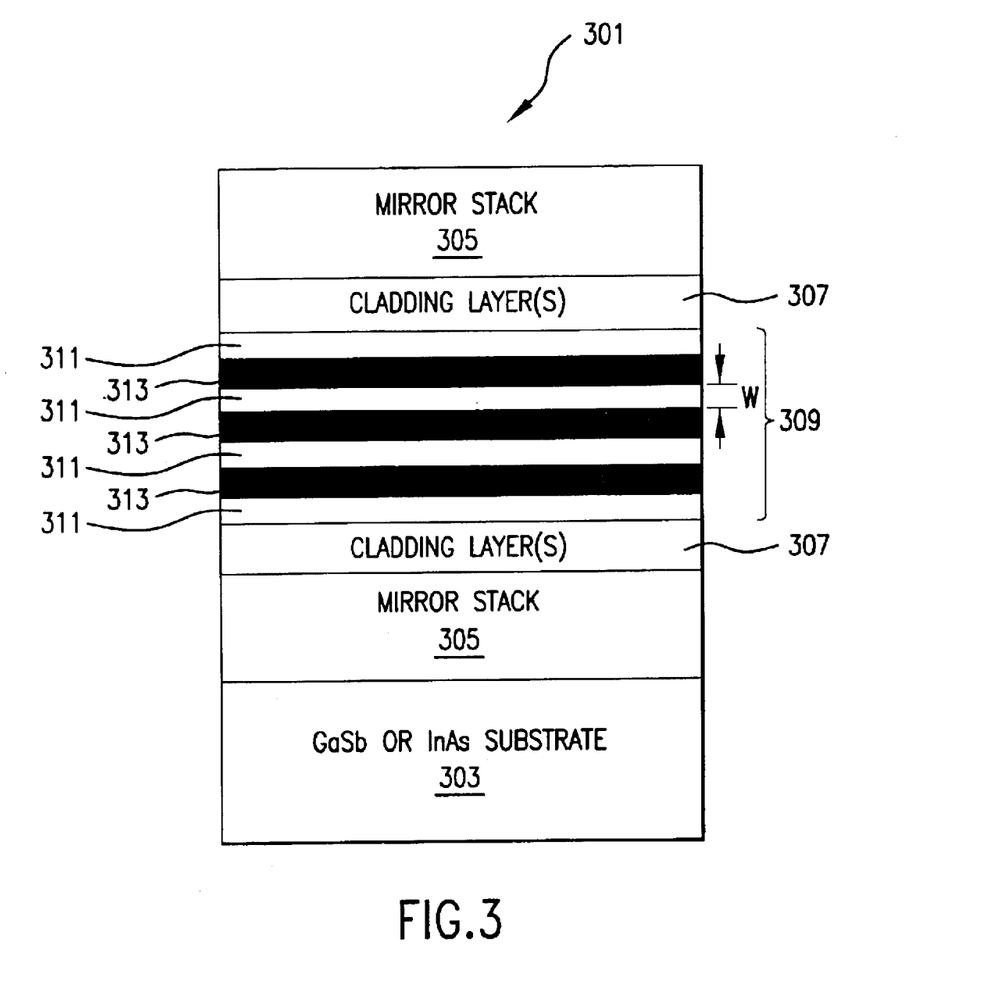
FIG. 3 is a simplified cross-sectional side view of the present invention.

Referring to FIG. 3, a VCSEL 301 according to one embodiment of the present invention is illustrated. The VCSEL 301 is based on a substrate 303 of GaSb or InAs. The VCSEL 301 has a first mirror stack 305 and a second mirror stack 305, the first mirror stack 305 adjacent to the substrate. Preferably, the two mirror stacks 305 are epitaxially grown, although other methods such as fusion bonding, deposition of dielectric mirror, etc. are also acceptable. In between the two mirror stacks 305 are two cladding layers 307. The cladding layers 307 are also preferably epitaxially grown.

In between the two cladding layers 307 is an active region 309. The active region 309 includes alternating quantum wells 311 and barrier layers 313. The quantum wells are made of $Ga_xIn_{1-x}Sb_yP_{1-y}$, $Al_xIn_{1-x}Sb_yAs_{1-y}$, $Ga_xIn_{1-x}Sb_yAs_{1-y}$, or $Al_xIn_{1-x}Sb_yP_{1-y}$, where x and y have values ranging from 0 to 1. The quantum wells have a width w. The barrier layers 313 can be made of $Al_sIn_{1-s}Sb_tP_{1-t}$, $Al_sGa_{1-s}Sb_tP_{1-t}$, $Al_sIn_{1-s}Sb_tAs_{1-t}$, $Al_sGa_{1-s}Sb_tAs_{1-t}$, or $AlSb_sP_tAs_{1-s-t}$, where s and t have values ranging from 0 to 1. For ease of use, the quantum well materials may be referred to without their subscripts as GaInSbP, AlInSbAs, GaInSbAs, or AlInSbP. For ease of use, the barrier layer materials may be referred to without their subscripts as AlInSbP, AlGaSbP, AlInSbAs, AlGaSbAs, or AlSbPAs. The quantum wells 311 and barrier layers 313 can be either tensile or compressive strained, or lattice matched to the substrate. Although they are illustrated as equal in width in FIG. 3, the quantum wells 311 and barrier layers 313 can have different widths.

In a preferred embodiment, the first and second mirror stacks 305 are DBRs made of high and low refractive index layers of AlGaAsSb. AlGaAsSb is a preferred material for use in the mirror stacks 305 because it can be oxidized, a desirable quality as previously mentioned. Other materials that may be used in the mirror stack 305 are AlGaSbP, AlInAsSb, AlInSbP, AlAsSbP, AlInGaSb. The first mirror stack 305 does not have to made of the same materials as the second mirror stack 305. The mirror stacks 305 and cladding layers 307 are conventional structures common in VCSEL design. Various materials that have the appropriate reflective properties suitable for use in the mirror stacks 305 and cladding layers 307 are well known to persons skilled in the art, and thus will not be further discussed in detail here.

Figure 4A:
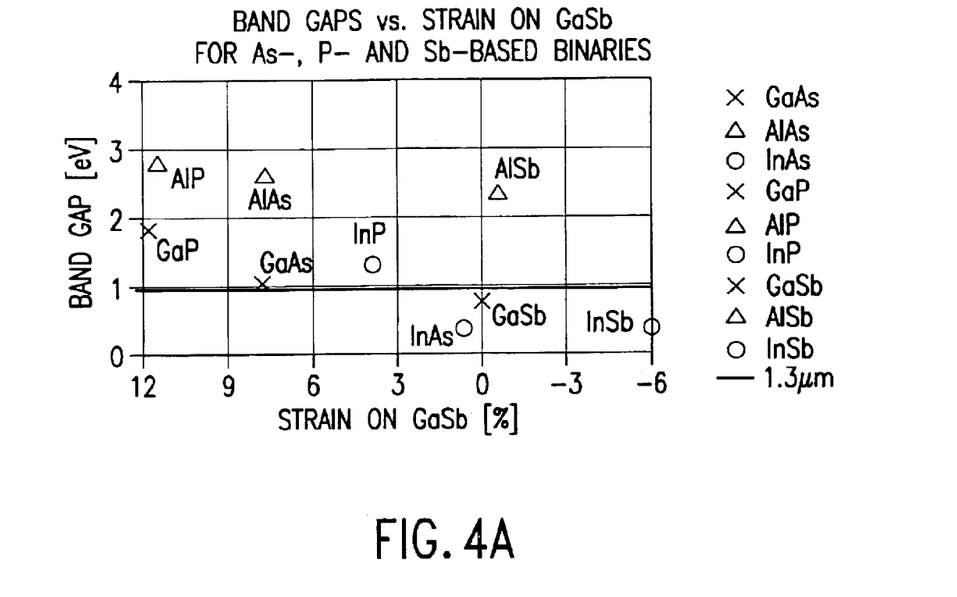
FIG. 4A is a plot of the band gap values for selected binary compounds against the lattice strain on a GaSb substrate.
Figure 4B:
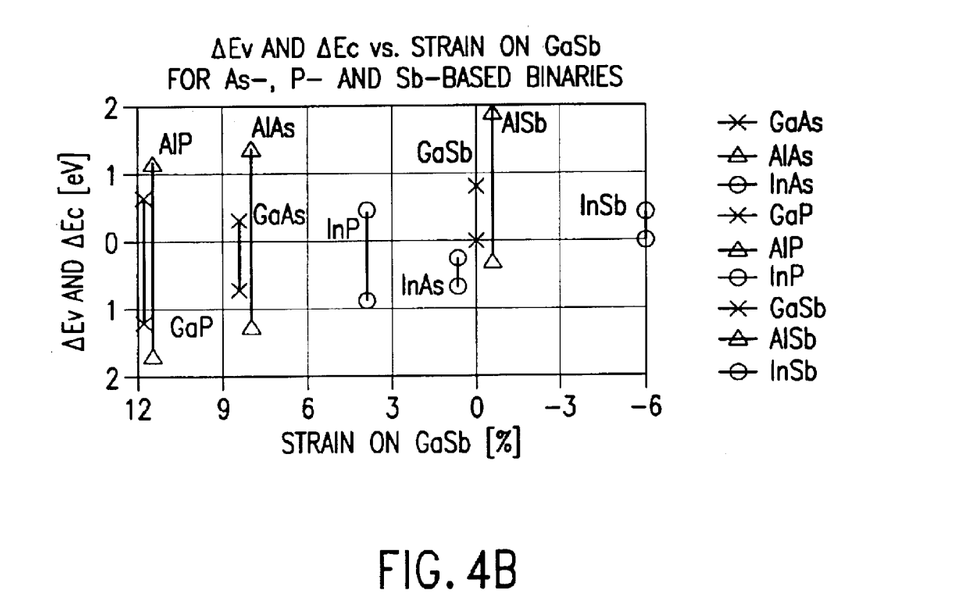
FIG. 4B plots conduction band offsets ($\Delta E_c$) and valence band offsets ($\Delta E_v$) for selected binary compounds against the lattice strain on a GaSb substrate.

The band parameters of the alloys used in the quantum wells 311 and barrier layers 313 of the present invention are well known or can be easily interpolated from the known band parameters of binary compounds. (See "Band Parameters for III–V Compound Semiconductors and Their Alloys", Journal of Applied Physics, Volume 89, Number 11, 1 Jun. 2001, pages 5815–5875.) FIGS. 4A–4B plot various band parameters for selected binary compounds. Using the data represented within these figures, the band parameters for the proposed quaternary compounds can be determined through interpolations. These interpolations are not explicitly shown in the figures, since they are difficult to depict. Also, since these interpolations are well known in the art, they do not need to be described in detail here. Instead, the binary compound parameters are illustrated to give a general idea as to what the parameters for the quaternary compounds would be.

FIG. 4A plots the band gaps for selected binary compounds that can be used to form an active region, against the lattice strain on a GaSb substrate for the VCSEL of FIG. 3. Interpolations can be performed on this data to determine the band gaps and lattice strain of quaternary alloys formed from the binary compounds shown in FIG. 4A. A line delineating the band gap that produces a 1.3 um wavelength (the midpoint of the target wavelength range) is superimposed on the graph.

Suitable alloys for use in the quantum wells 311 of the present invention have band gaps $E_g^{QW}$ that produce light emissions in the desired range of wavelengths, as calculated by Equation 1. Such alloys can be identified from FIG. 4A. (Although not explicitly illustrated in FIG. 4A, the quantum confinement energy $dE_{qc}$ and lattice strain energy $dE_{strain}$ should also be factored into the calculations, as shown in Equation 1.) The alloys selected should be lattice matched or have very little strain on the substrate. Up to 2% strain may be acceptable, depending on the growth conditions and quality. As indicated by FIG. 4A, quantum wells made of GaInSbP, AlInSbAs, GaInSbAs or AlInSbP can be lattice matched (or matched with minimal strain) to a GaSb or InAs substrate, and emit light within the desired range of wavelengths.

FIG. 4B plots conduction band offsets ($\Delta E_c$) and valence band offsets ($\Delta E_v$) for selected binary compounds against lattice strain on a GaSb substrate. Interpolations can be performed on this data to determine $\Delta E_c$ and $\Delta E_v$ for quaternary alloys formed from the binary compounds shown in FIG. 4A; such interpolations are well known in the art and, as such, do not need to be described in detail here. A suitable pair of alloys for use in the present invention has a $\Delta E_c$ and $\Delta E_v$ that provides sufficient carrier confinement to guarantee device performance over the temperature range of interest, which is 0–100° C. For satisfactory operation over the desired temperature range, $\Delta E_c$ for the selected alloys should preferably be ~100 meV or greater, and $\Delta E_v$ should be ~35 meV or greater. Based on interpolations of the data in FIG. 4B one can show that GaInSbP, AlInSbAs, GaInSbAs, or AlInSbP quantum wells with AlInSbP, AlGaSbP, AlInSbAs, AlGaSbAs, or AlSbPAs barrier layers will fit these criteria. The characteristic temperature $T_0$ of these active regions can also be at least as high as, if not higher than the characteristic temperature $T_0$ of the GaAs/AlGaAs active region, provided that the material quality is comparable. The information available in FIG. 4B also indicates that InAs would make a suitable lattice-matching substrate for the above-mentioned quantum well and barrier layers.

Figure 5A:
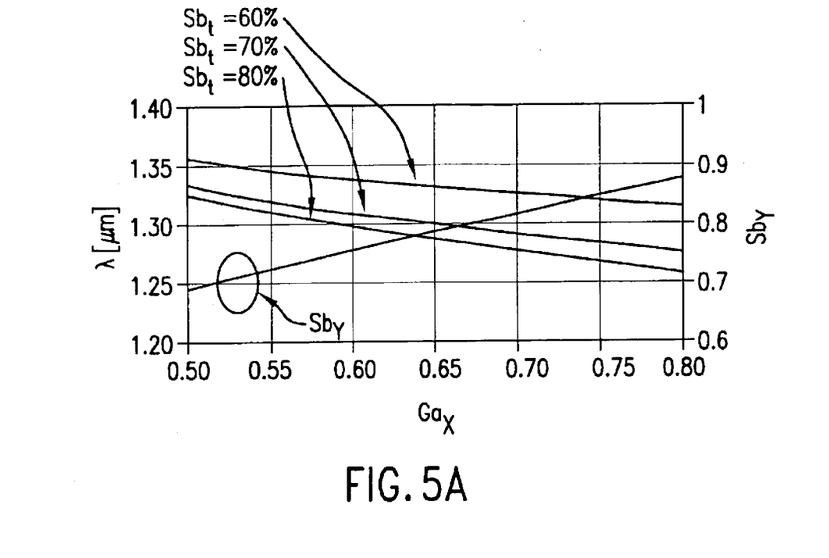
FIG. 5A plots the first electron-heavy-hole (E-HH1) transitions for an GaInSbP/AlInSbAs active region as a function of Ga composition in the quantum well.
Figure 5B:
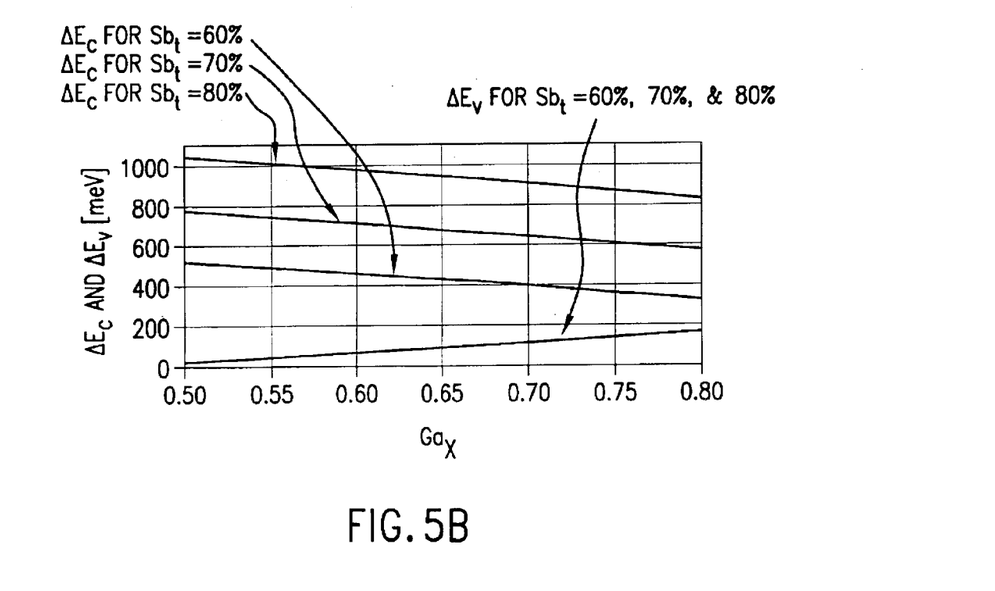
FIG. 5B plots the conduction band offset ($\Delta E_c$) and valence band offsets ($\Delta E_v$) as a function of Ga composition in the quantum well for a GaInSbP/AlInSbAs active region.

As discussed throughout, the ideal active region for a long-wavelength VCSEL should satisfy the following requirements: possess minimal lattice strain, emit light with a wavelength within the target range, and maximize carrier containment to maintain performance over the operating temperature range. FIGS. 5A–5B are graphs depicting the characteristics of a sample GaInSbP/AlInSbAs active region (lattice-matched to a GaSb substrate) that meets these requirements. FIG. 5A plots the first electron-heavy-hole (E-HH1) in a GaInSbP/AlInSbAs material system, as a function of Ga composition in the quantum well and for three different values of Sb in the barrier layer. FIG. 5B plots the conduction band offset ($\Delta E_c$) and valence band offset ($\Delta E_v$) for the same material system described in FIG. 5A, as a function of Ga composition in the quantum well and for three different values of Sb in the barrier layer.

The alloy composition in the quantum well of the sample active region is represented by $Ga_xIn_{1-x}Sb_yP_{1-y}$; the alloy composition in the barrier layer is represented by $Al_sIn_{1-s}Sb_tAs_{1-t}$. For the purposes of this example, the molecular fractions of the elements have been selected to lattice match the active region to the GaSb substrate. In material systems that cannot be lattice matched to the substrate, the lattice strain should be reduced as much as possible. The quantum well width w has been set at 35 Angstroms.

The wavelength of emitted light in the sample GaInSbP/AlInSbAs active region is controlled by the amount of Ga (as indicated by the x-axis) in the quantum well. As can be seen from FIG. 5A, increasing the amount of Ga in the quantum well decreases the wavelength of emitted light. The amount of Sb in the quantum well (as indicated on the right y-axis labeled $Sb_y$ in FIG. 5A) is chosen so that the quantum well is lattice matched to the GaSb substrate. The quantum well width w has been fixed at 35 Angstroms in this example, but the width of the quantum well can also be varied (affecting the quantum confinement energy $dE_{qc}$ in Equation 1) to modify the emission wavelength.

As can be seen from FIG. 5B, varying the amount of Ga in the quantum well or Sb in the barrier layer changes the values for $\Delta E_c$ and $\Delta E_v$. $\Delta E_c$ and $\Delta E_v$ should be selected to provide effective carrier containment. For example, with 60% Ga in the quantum well and 60% Sb in the barrier layer, the GaInSbP/AlInSbAs material system has a conduction band offset of ~450 meV, and a valence band offset of ~100 meV. Previously, it was stated that $\Delta E_c \approx 150$ meV and $\Delta E_v \approx 75$ meV for 850 nm GaAs/AlGaAs quantum wells. Therefore, the material system of FIGS. 5A–5B (in the molecular fractions proposed) can be designed to exceed the band offsets of the 850 nm VCSELS and provide sufficient confinement for satisfactory device performance over the temperature range of interest.

Using methods well known in the art (and similar to the methods for determining an appropriate alloy composition for the sample active region of FIGS. 5A–5B), appropriate compositions can be calculated for all of the suggested alloys and quantum well/barrier pairings, as well as for both GaSb and InAs substrates. Using the criteria listed in Table 1, a preferable range of compositions can be determined for the proposed quaternary alloys and substrates. Tables 2–5 list these preferred ranges.

TABLE 1

| Parameter | Minimum Value | Maximum Value |
|---|---|---|
| Quantum well width | 30 nm | 120 nm |
| E-HH1 Wavelength | 1.2 um | 1.4 um |
| Strain in quantum well | −2% | 2% |
| Strain in barrier layer | −2% | 2% |
| Conduction band offset ($\Delta E_c$) | 100 meV | |
| Valence band offset ($\Delta E_v$) | 35 meV | |
| X-Gamma separation | 100 meV | |
| L-Gamma separation | 100 meV | |
| SO-Gamma separation | 100 meV | |

TABLE 2

| | Barrier Layer | | | | $Ga_xIn_{1-x}Sb_yP_{1-y}$ in Quantum Well | | | |
|---|---|---|---|---|---|---|---|---|
| | Min s | Max s | Min T | Max t | Min x | Max x | Min y | Max y |
| GaSb substrates | | | | | | | | |
| $Al_sIn_{1-s}Sb_tP_{1-t}$ | 20% | 95% | 35% | 95% | 0% | 85% | 25% | 95% |
| $Al_sGa_{1-s}Sb_tP_{1-t}$ | 25% | 95% | 80% | 95% | 15% | 85% | 40% | 95% |
| $Al_sIn_{1-s}Sb_tAs_{1-t}$ | 35% | 95% | 15% | 95% | 20% | 85% | 45% | 95% |
| $Al_sGa_{1-s}Sb_tAs_{1-t}$ | 30% | 95% | 70% | 95% | 40% | 85% | 70% | 95% |
| $AlSb_sP_tAs_{1-s-t}$ | 70% | 95% | 0% | 20% | 15% | 85% | 40% | 95% |
| InAs substrates | | | | | | | | |
| $Al_sIn_{1-s}Sb_tP_{1-t}$ | 10% | 95% | 20% | 95% | 0% | 85% | 20% | 95% |
| $Al_sGa_{1-s}Sb_tP_{1-t}$ | 20% | 95% | 75% | 95% | 5% | 85% | 65% | 95% |
| $Al_sIn_{1-s}Sb_tAs_{1-t}$ | 35% | 95% | 5% | 95% | 10% | 85% | 35% | 95% |
| $Al_sGa_{1-s}Sb_tAs_{1-t}$ | 25% | 95% | 60% | 95% | 35% | 85% | 65% | 95% |
| $AlSb_sP_tAs_{1-s-t}$ | 60% | 95% | 0% | 25% | 5% | 85% | 30% | 95% |

TABLE 3

| | Barrier Layer | | | | $Al_xIn_{1-x}Sb_yAs_{1-y}$ in Quantum Well | | | |
|---|---|---|---|---|---|---|---|---|
| | Min s | Max s | Min t | Max t | Min x | Max x | Min y | Max y |
| GaSb substrates | | | | | | | | |
| $Al_sIn_{1-s}Sb_tP_{1-t}$ | 20% | 95% | 35% | 95% | 15% | 30% | 0% | 60% |
| $Al_sGa_{1-s}Sb_tP_{1-t}$ | 30% | 95% | 80% | 95% | 15% | 30% | 10% | 60% |
| $Al_sIn_{1-s}Sb_tAs_{1-t}$ | 35% | 95% | 15% | 95% | 20% | 30% | 15% | 60% |
| $Al_sGa_{1-s}Sb_tAs_{1-t}$ | 55% | 95% | 70% | 95% | 20% | 25% | 50% | 60% |
| $AlSb_sP_tAs_{1-s-t}$ | 70% | 95% | 0% | 20% | 15% | 25% | 0% | 60% |
| InAs substrates | | | | | | | | |
| $Al_sIn_{1-s}Sb_tP_{1-t}$ | 20% | 95% | 25% | 95% | 15% | 30% | 0% | 55% |
| $Al_sGa_{1-s}Sb_tP_{1-t}$ | 20% | 95% | 75% | 95% | 15% | 30% | 0% | 55% |
| $Al_sIn_{1-s}Sb_tAs_{1-t}$ | 35% | 95% | 5% | 65% | 15% | 25% | 0% | 50% |
| $Al_sGa_{1-s}Sb_tAs_{1-t}$ | 70% | 95% | 60% | 65% | 20% | 25% | 45% | 50% |
| $AlSb_sP_tAs_{1-s-t}$ | 60% | 95% | 5% | 25% | 15% | 25% | 0% | 50% |

TABLE 4

| | Barrier Layer | | | | $Ga_xIn_{1-x}Sb_yAs_{1-y}$ in Quantum Well | | | |
|---|---|---|---|---|---|---|---|---|
| | Min s | Max s | Min t | Max t | Min x | Max x | Min y | Max y |
| GaSb substrates | | | | | | | | |
| $Al_sIn_{1-s}Sb_tP_{1-t}$ | 50% | 95% | 65% | 95% | 65% | 95% | 60% | 95% |
| $Al_sGa_{1-s}Sb_tP_{1-t}$ | 35% | 95% | 80% | 95% | 75% | 95% | 80% | 95% |
| $Al_sIn_{1-s}Sb_tAs_{1-t}$ | 35% | 95% | 35% | 95% | 65% | 95% | 45% | 95% |
| $Al_sGa_{1-s}Sb_tAs_{1-t}$ | 55% | 95% | 70% | 95% | 20% | 95% | 45% | 95% |
| $AlSb_sP_tAs_{1-s-t}$ | 70% | 95% | 0% | 20% | 75% | 95% | 80% | 95% |
| InAs substrates | | | | | | | | |
| $Al_sIn_{1-s}Sb_tP_{1-t}$ | 25% | 95% | 55% | 95% | 20% | 95% | 20% | 95% |
| $Al_sGa_{1-s}Sb_tP_{1-t}$ | 25% | 95% | 75% | 95% | 65% | 95% | 35% | 95% |
| $Al_sIn_{1-s}Sb_tAs_{1-t}$ | 30% | 95% | 30% | 95% | 20% | 95% | 25% | 95% |
| $Al_sGa_{1-s}Sb_tAs_{1-t}$ | 25% | 95% | 60% | 65% | 20% | 95% | 40% | 95% |
| $AlSb_sP_tAs_{1-s-t}$ | 60% | 95% | 0% | 25% | 70% | 95% | 40% | 95% |

TABLE 5

| | Barrier Layer | | | | $Al_xIn_{1-x}Sb_yP_{1-y}$ in Quantum Well | | | |
|---|---|---|---|---|---|---|---|---|
| | Min s | Max s | Min t | Max t | Min x | Max x | Min y | Max y |
| GaSb substrates | | | | | | | | |
| $Al_sIn_{1-s}Sb_tP_{1-t}$ | 25% | 95% | 35% | 90% | 0% | 25% | 25% | 70% |
| $Al_sGa_{1-s}Sb_tP_{1-t}$ | 50% | 95% | 80% | 90% | 10% | 20% | 45% | 65% |
| $Al_sIn_{1-s}Sb_tAs_{1-t}$ | 40% | 85% | 20% | 55% | 10% | 25% | 50% | 70% |
| $AlSb_sP_tAs_{1-s-t}$ | 75% | 95% | 5% | 20% | 10% | 20% | 45% | 65% |
| InAs substrates | | | | | | | | |
| $Al_sIn_{1-s}Sb_tP_{1-t}$ | 10% | 95% | 20% | 85% | 0% | 20% | 20% | 60% |
| $Al_sGa_{1-s}Sb_tP_{1-t}$ | 50% | 95% | 75% | 90% | 5% | 15% | 35% | 60% |
| $Al_sIn_{1-s}Sb_tAs_{1-t}$ | 30% | 85% | 5% | 50% | 10% | 20% | 40% | 60% |
| $AlSb_sP_tAs_{1-s-t}$ | 65% | 90% | 10% | 25% | 5% | 15% | 35% | 60% |

Although the present invention has been described in detail with reference to particular preferred embodiments, persons possessing ordinary skill in the art to which this invention pertains will appreciate that various modifications and enhancements may be made without departing from the spirit and scope of the claims that follow. For example, the active regions described for VCSELs may also be used in other types of lasers, such as edge-emitting diodes.

I claim:

1. A laser device comprising:
   a substrate;
   a first and second mirror stack, the first mirror stack position proximate to the substrate;
   a first and second cladding layer, interposing the first and second mirror stack; and
   an active region, interposing the first and second cladding layer, the active region having at least one quantum well having a first and second face, the first face adjacent to a first barrier layer and the second face adjacent to a second barrier layer, wherein
   (a) the quantum well includes material selected from the group consisting of $Ga_xIn_{1-x}Sb_yP_{1-y}$, $Al_xIn_{1-x}Sb_yAs_{1-y}$, $Ga_xIn_{1-x}Sb_yAs_{1-y}$, and $Al_xIn_{1-x}Sb_yP_{1-y}$, where x and y have values ranging from 0 to 1; and
   (b) each of the first and second barrier layers include material selected from the group consisting of $Al_sIn_{1-s}$ $Sb_tP_{1-t}$, $Al_sGa_{1-s}Sb_tP_{1-t}$, $Al_sIn_{1-s}Sb_tAs_{1-t}$, $Al_sGa_{1-s}Sb_tAs_{1-t}$, and $AlSb_sP_tAs_{1-s-t}$, where s and t have values ranging from 0 to 1.

2. A laser device as in claim 1, wherein the mirror stacks are epitaxially grown.

3. A laser device as in claim 2, wherein the mirror stacks include material selected from the group consisting of AlGaAsSb, AlGaSbP, AlInAsSb, AlInSbP, AlAsSbP or AlInGaSb.

4. A laser device as in claim 3, wherein the mirror stacks are Distributed Bragg Reflectors.

5. A laser device as in claim 1, wherein the active region emits light at a wavelength between 1.2 um and 1.4 um, inclusive.

6. A laser device as in claim 5, wherein the active region emits light at a wavelength of 1.310 um.

7. A laser device as in claim 1, wherein the substrate includes GaSb.

8. A laser device as in claim 7, wherein the quantum well material $Ga_xIn_{1-x}Sb_yP_{1-y}$, in which $0 \leq x \leq 0.85$ and $0.25 \leq y \leq 0.95$, and.

9. A laser device as in claim 7, wherein the quantum well material is $Al_xIn_{1-x}Sb_yAs_{1-y}$, in which $0.15 \leq x \leq 0.30$ and $0 \leq y \leq 0.60$.

10. A laser device as in claim 7, wherein the quantum well material is $Ga_xIn_{1-x}Sb_yAs_{1-y}$, in which $0.20 \leq x \leq 0.95$ and $0.45 \leq y \leq 0.95$.

11. A laser device as in claim 7, wherein the quantum well material is $Al_xIn_{1-x}Sb_yP_{1-y}$, in which $0 \leq x \leq 0.25$ and $0.25 \leq y \leq 0.70$.

12. A laser device as in claim 1, wherein the substrate includes InAs.

13. A laser device as in claim 12, wherein the quantum well material is $Ga_xIn_{1-x}Sb_yP_{1-y}$, in which $0 \leq x \leq 0.85$ and $0.20 \leq y \leq 0.95$.

14. A laser device as in claim 12, wherein the quantum well material is $Al_xIn_{1-x}Sb_yAs_{1-y}$, in which $0.15 \leq x \leq 0.30$ and $0 \leq y \leq 0.55$.

15. A laser device as in claim 12, wherein the quantum well material is $Ga_xIn_{1-x}Sb_yAs_{1-y}$, in which $0.20 \leq x \leq 0.95$ and $0.20 \leq y \leq 0.95$.

16. A laser device as in claim 12, wherein the quantum well material is $Al_xIn_{1-x}Sb_yP_{1-y}$, in which $0 \leq x \leq 0.20$ and $0.20 \leq y \leq 0.60$.

17. A laser device as in claim 1, wherein the laser is a VCSEL.

18. A laser device as in claim 1, wherein the laser is an edge-emitting laser.

19. A laser device as in claim 1, wherein the laser operates between 0–100° C.

* * * * *